United States Patent [19]
Byatt et al.

[11] 4,090,212
[45] May 16, 1978

[54] IMAGING DEVICE

[75] Inventors: Dennis William George Byatt, Great Baddow; Harold Thomas Brown, Hatch End, both of England

[73] Assignee: The Marconi Company Limited, Chelmsford, England

[21] Appl. No.: 780,698

[22] Filed: Mar. 24, 1977

[30] Foreign Application Priority Data

Mar. 27, 1976 United Kingdom ............... 12414/76

[51] Int. Cl.² .......................................... H01L 29/78
[52] U.S. Cl. ...................................... 357/24; 357/31; 357/30; 357/28; 357/54; 357/23
[58] Field of Search ....................... 357/24, 31, 23, 54, 357/52, 28, 30

[56] References Cited

U.S. PATENT DOCUMENTS

| | | | |
|---|---|---|---|
| 3,992,716 | 11/1976 | DiStefano | 357/24 |
| 4,019,200 | 4/1977 | Adkins | 357/26 |
| 4,024,560 | 5/1977 | Miller | 357/23 |

Primary Examiner—Martin H. Edlow
Attorney, Agent, or Firm—Diller, Brown, Ramik & Wight

[57] ABSTRACT

An imaging device which responds to incident thermal or acoustic signals, consists of a layer of electrically poled plastics material, such as polyvinyladene fluoride, on a semiconductor substrate. The plastics material enables an electric charge to be generated within the semiconductor, and the device is read by transferring the charges in 'packets' to an output point.

4 Claims, 1 Drawing Figure

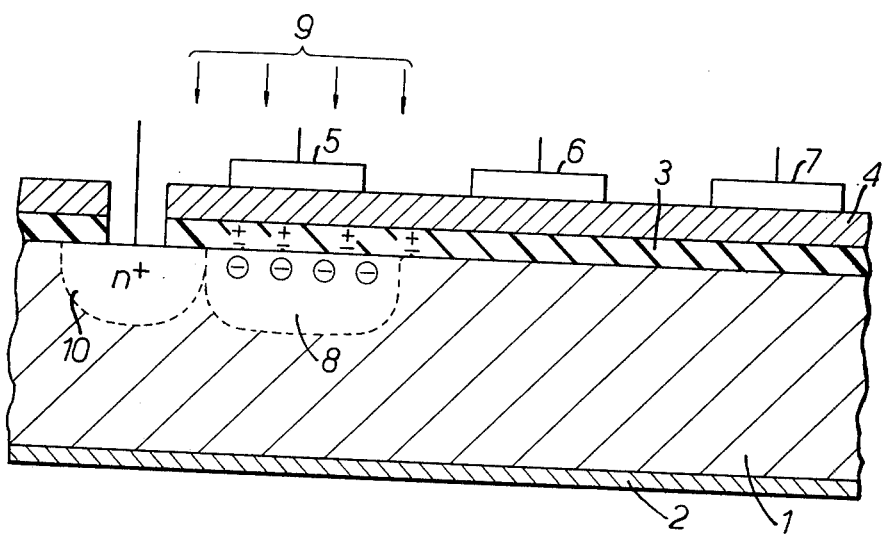

IMAGING DEVICE

This invention relates to imaging devices, and seeks to provide improved such devices.

According to a first aspect of this invention, an imaging device includes a p-type or n-type semiconductor substrate having one major surface which carries a layer of insulating material which in turn is overlaid by a layer of electrically poled plastics material on which an array of electrodes is disposed.

The imaging device is arranged to respond to the effect of an appropriate image incident on the electrically poled plastics material. The nature of the incident image is such as to affect and alter the thickness of the plastics material, and both thermal and acoustic images have this effect.

According to a second aspect of this invention, a thermal imaging device includes a p-type or n-type semiconductor substrate having one major surface which carries a layer of insulating material which in turn is overlaid by a layer of electrically poled plastics material on which an array of electrodes is disposed.

Preferably the substrate is composed of p-type silicon which is provided with an insulating surface layer of silicon dioxide.

Preferably again the electrically poled plastics material is polyvinyladene fluoride.

The surface of the thermal imaging device which carries the array of electrodes, is arranged, in operation, to receive the thermal image. Electrically poled plastics material, especially polyvinyladene fluoride, generates an electrical signal when it is heated or cooled, and this electrical signal is, in this invention, used to produce corresponding charge patterns in the semiconductor material under the insulating layer. Although it is not essential to use p-type silicon as the semiconductor substrate material, it is nevertheless preferred to do so.

The invention is further described, by way of example, with reference to the accompanying drawings, which shows a section view of a thermal imaging device in accordance with the present invention.

Referring to the drawing, the thermal imaging device consists essentially of a charge coupled device having a layer of electrically poled plastics material lying under the control or clock electrodes.

The device consists of a body of p-type silicon semiconductor material 1, having a continuous ground electrode 2 on its underside, and a continuous layer of insulating material 3, in this case silicon dioxide, on its upper surface. A layer of electrically poled polyvinyladene fluoride ($PVF_2$) 4 is positioned between the layer 3 of silicon dioxide and discrete clock electrodes 5, 6, 7.

The layer of $PVF_2$ is nominally only a few micrometers thick, and may be laid down and bonded in sheet form, or it may alternatively be evaporated or sputtered onto the silicon dioxide surface, after which the electrodes, 5, 6, 7, which are metal, can be deposited in the usual way.

The electrical polarisation of the material $PVF_2$ can be produced by softening the material by raising its temperature to about 100° C, whilst a polarisation voltage of the order of 100KV per cm is applied for several hours, and maintained whilst the material cools. This process causes the polarised ions of the polymer molecules to orientate along the electric field, and to produce a substantially permanently charged plastics sheet.

Apart from the layer of $PVF_2$, the device is basically similar to conventional charge coupled devices. Charge coupled devices are now well known and are described in, for example, the booklet entitled 'Charge Coupled Devices' published by GEC Semiconductors Limited, prior to the date of this application.

When a thermal image falls upon the layer of $PVF_2$, electric signals are generated within the layer, producing a corresponding charge distribution in the p-type silicon material 1. Assuming that the thermal image (as represented by arrows 9) produces a localised heated region around electrode 5, the modification of the thickness of the $PVF_2$ layer in that region results in the formation of electric charges, which in turn produces a modified depletion region 8 in the body of the silicon material 1.

A charge packet may be formed in the region 8, and in all similar regions along an array of such electrodes, by flooding the array with charge injected from a diffused $n^+$ region 10 whose voltage is suitably changed so as to inject charge into the whole array.

variation variations in size of the charge packets so formed will then be representative of temperature variations in the image. The charge packets are formed during periods $t_1$, when no clock signals are applied to the electrodes. During a following read-out period $t_2$, the charge packets are swept, in order, to the edge of the device, by the application of a regular sequence of clock pulses applied to the different electrodes. Although only three electrodes 5, 6, 7 are shown, in practice very many electrodes are provided, forming a complete and regular array on the surface of the device which receives incident thermal image.

We claim:

1. An imaging device including a p-type or n-type semiconductor substrate having one major surface which carries a layer of insulating material which in turn is overlaid by a layer of electrically poled plastics material on which an array of electrodes is disposed.

2. A thermal imaging device including a p-type or n-type semiconductor substrate having one major surface which carries a layer of insulating material which in turn is overlaid by a layer of electrically poled plastics material on which an array of electrodes is disposed.

3. A device as claimed in claim 1 in which the substrate is composed of p-type silicon which is provided with an insulating surface layer of silicon dioxide.

4. A device as claimed in claim 1, in which the electrically poled plastics material is polyvinyladene fluoride.

* * * * *